(12) United States Patent
Hu et al.

(10) Patent No.: US 10,228,736 B2
(45) Date of Patent: Mar. 12, 2019

(54) RESET ISOLATION FOR AN EMBEDDED SAFETY ISLAND IN A SYSTEM ON A CHIP

(71) Applicant: TEXAS INSTRUMENTS INCORPORATED, Dallas, TX (US)

(72) Inventors: Chunhua Hu, Plano, TX (US); Venkateswar Reddy Kowkutla, Allen, TX (US); Charles Fuoco, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 28 days.

(21) Appl. No.: 15/395,156

(22) Filed: Dec. 30, 2016

(65) Prior Publication Data
US 2018/0189156 A1 Jul. 5, 2018

(51) Int. Cl.
G06F 1/24 (2006.01)

(52) U.S. Cl.
CPC .................................. G06F 1/24 (2013.01)

(58) Field of Classification Search
CPC ............................ G06F 1/24; G06F 11/1441
USPC ........................................................ 714/30, 31
See application file for complete search history.

(56) References Cited

U.S. PATENT DOCUMENTS

2013/0238916 A1* 9/2013 Dohm ................ H03K 19/0008
713/320
2016/0357696 A1* 12/2016 Klinglesmith ...... G06F 13/4068

* cited by examiner

Primary Examiner — Joseph R Kudirka
(74) Attorney, Agent, or Firm — Kenneth Liu; Charles A. Brill; Frank D. Cimino

(57) ABSTRACT

The reset isolation mechanism describes an embedded safety island inside a system on a chip which reduces the overall system cost while achieving functional safety. The safety island ensures an orderly shutdown of all or part of the rest of the system on a chip without the possibility of a safety island hang due to incomplete transactions at the time of the reset.

11 Claims, 3 Drawing Sheets

RESET ISOLATION FOR AN EMBEDDED SAFETY ISLAND IN A SYSTEM ON A CHIP

BACKGROUND OF THE INVENTION

A functional safety system often requires implementing voltage detectors and supervisory functions for a complex System on a Chip (SoC) in a larger system. Implementing those functions outside of the SoC not only increases the overall system cost, it also lacks the critical features to achieve high level functional safety standard specified by ISO 2626 and IEC 61508.

SUMMARY OF THE INVENTION

In order to design a complex SoC to achieve out of context functional safety features, embedded circuitry is required to generate an internal system reset with built in redundancy. Furthermore, the SoC also needs to comprehend the impact of external reset signals to make sure the device can enter a safe state when a fault occurs.

A fully integrated method is shown for generating a power on Reset on an SoC. Continuous voltage monitoring with integrated supervisory functions and reset sequencing is implemented, with redundant, multi stage voltage monitoring.

In order to optimize the system cost of implementing functional safety, a safety island is integrated inside a System on Chip (SoC) which contains a safety processor and safety related peripherals. During run time, the non-safety island portion of the SoC may go through reset, while the safety island is required to continue running safety functions. If the safety island has pending requests to the rest of the SoC when the reset happens, those pending transactions may be lost, leading to a safety island hang. This invention provides a hardware mechanism to prevent the safety island getting into hang condition in the above scenario.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
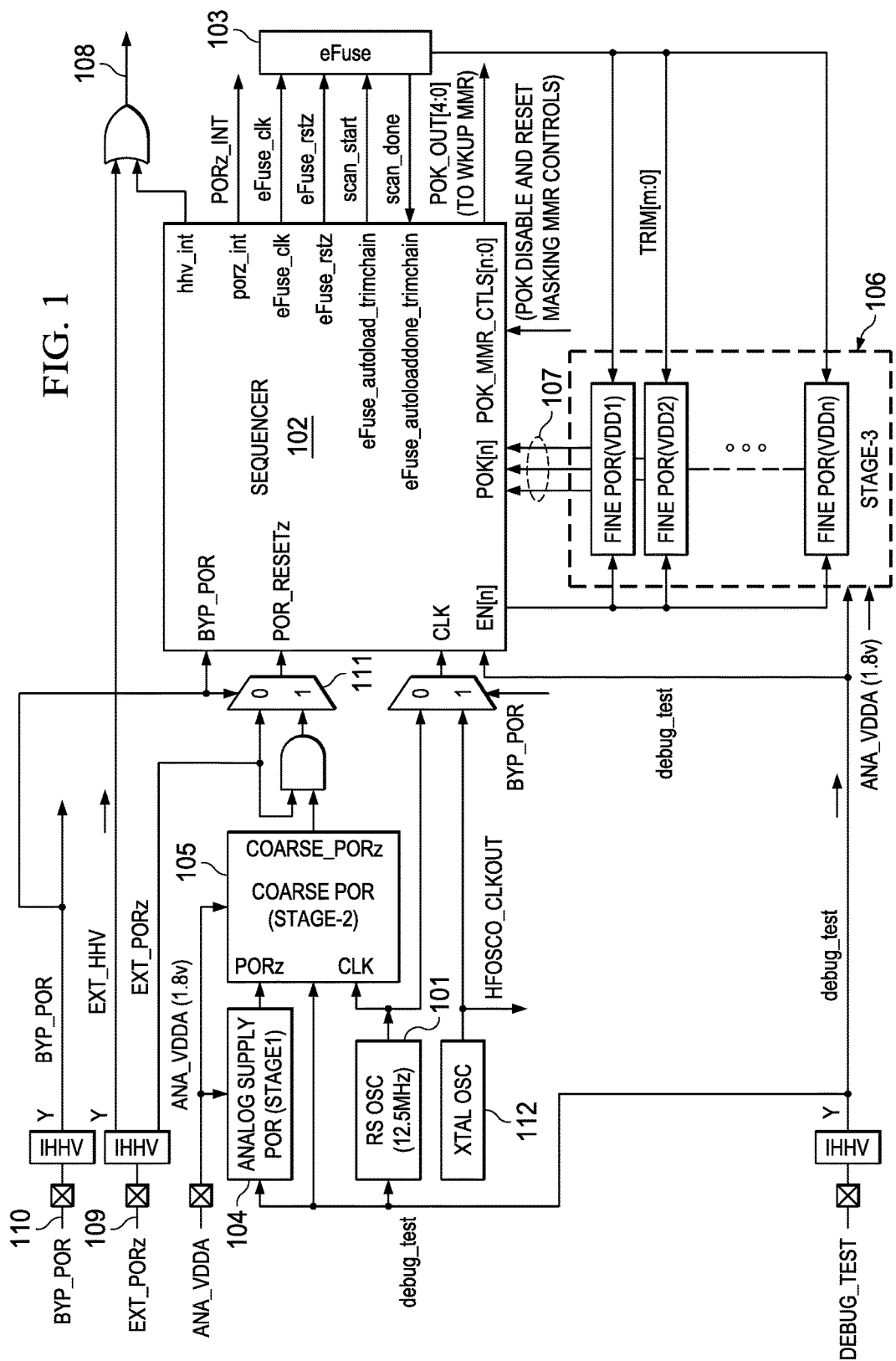
FIG. 1 shows a high level diagram of the reset circuit.

A fully integrated power on reset generation circuitry which can provide continuous voltage monitoring and reset sequencing is shown in FIG. 1. It incorporates control features such as redundancy and diagnostic capabilities which are critical to implement the functional safety feature.

The apparatus includes internal oscillators, a plurality of voltage detection stages and a power on reset (PoR) sequencer.

The internal RC oscillator 101 and crystal oscillator 112 are used to generate the clocks required by the power on reset (PoR) sequencer 102 and efuse module 103. The outputs of voltage monitors 104, 105 and 106 are passed through deglitching circuits to filter out false signals such as glitches and noise from the analog sensors.

The first stage voltage detection circuit 104 is an analog power supply level detector—this is to ensure that the voltage has reached a threshold level at which analog circuits can safely and reliably operate. The second stage voltage detection circuit 105 is a coarse level detector on analog voltage rails and some critical digital voltage rails, which are required for fine tuning analog sensors for process and temperature variations. The third stage voltage detection circuit 106 is a plurality of more accurate level detectors, which ensures that all voltage rails are operating within specified limits. The circuits implemented in first and second stage do not require any trim values to fine tune the analog circuits for process and temperature variation compensations. The first stage voltage detection circuit 104 controls the reset to the second stage voltage detection circuit 105, and second stage controls the reset to the third stage voltage detection circuit 106. Final master reset signal 108 to the SoC will be a combined version of resets from all 3 stages. This ensures that the device will always receive a reset even if one of the stages is defective therefore providing the required redundancy needed for safety critical applications.

Once the voltage levels are valid, the second stage voltage detection circuit 105 releases reset to only a small portion of the device which enables the device to initiate the efuse scanning. The efuse block 103 contain analog trim values for the voltage detection circuits implemented in the third stage voltage detection circuit 106 for accurate voltage level monitoring. The third stage holds the reset to the designated voltage domains until it detects proper voltage levels on the rails.

After the efuse scanning in efuse block 103 is complete, the power on reset (PoR) sequencer 102 applies the trim values read out from the efuse block 103 to the analog circuits for the voltage monitors in the third stage voltage detection circuit 106. The sequencer 102 then enables the voltage monitors for accurate detection of voltage levels on the rails. The sequencer then waits for a power OK (POK) signal 107 response from each individual detector circuit. When all the voltage monitors indicate power OK on the rails, power on reset sequencer 102 waits for all IOs and clock oscillators in the device to stabilize and then de-asserts the reset signal 108 to the designated voltage domain.

Provision is made for external reset signals 109 and 110 that will override the internally generated resets when selected by selector 111.

All reset signals are properly level shifted to the destination voltage level with appropriate pull-up or pull-down functions. This is to ensure that if the source voltage dies, the reset signal is still at an appropriate level to put the destination voltage domain in the reset state.

Figure 2:
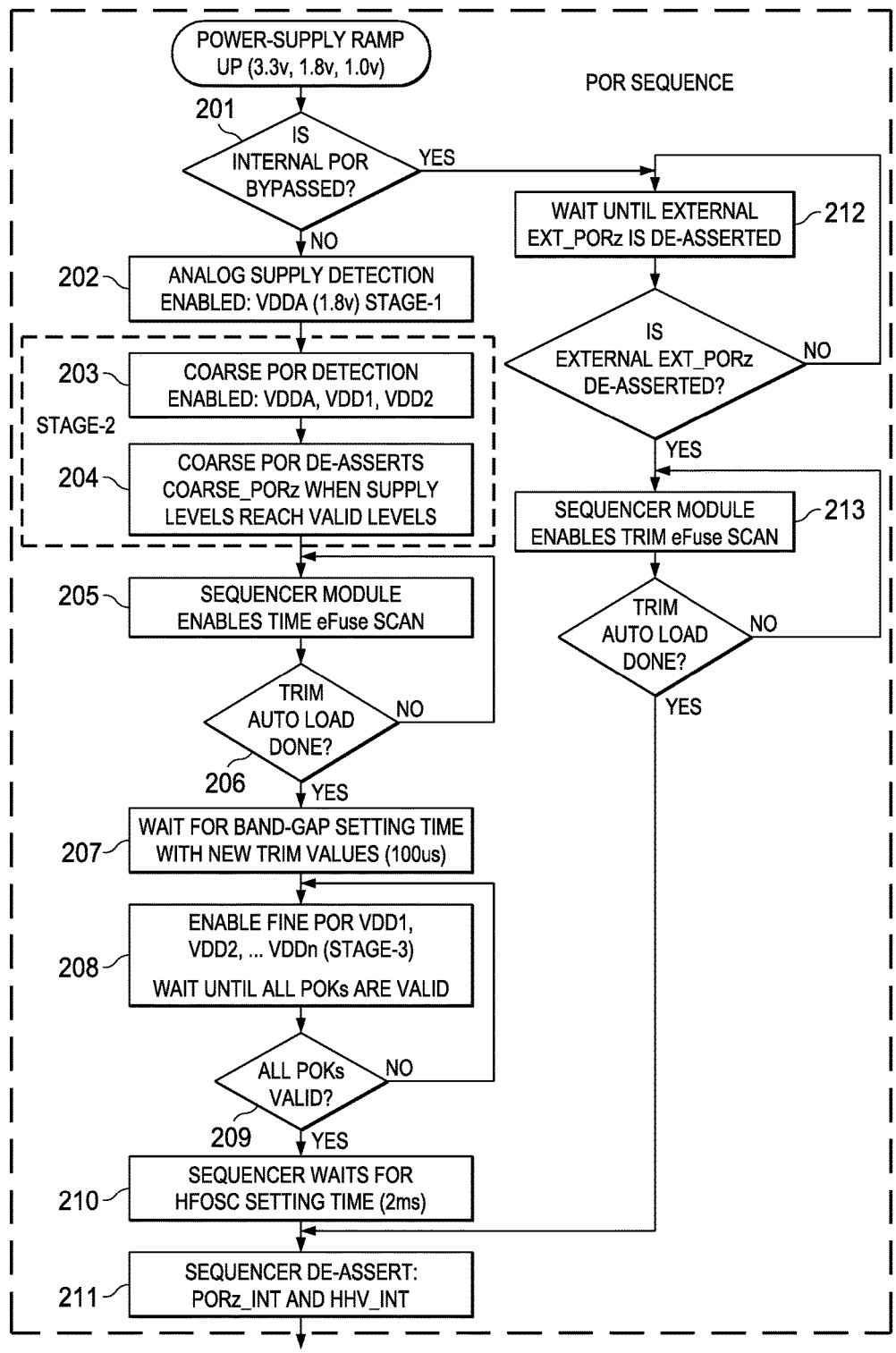
FIG. 2 is a flow chart of the reset function.

FIG. 2 shows the steps involved in the reset generation. Block 201 determines if the external PoR is asserted. If not, analog power supply detection is enabled in block 202, followed by coarse PoR detection in block 203. When power supply voltage levels reach valid levels, coarse PoR is deasserted in block 204. The sequencer module 102 now enables the trim efuse scan in block 205. When completion of the scan is determined in block 206, a settling time is introduced in block 207. After the settling time, the fine corrected power on reset signals are enabled in block 208. When all POK (Power OK) signals are valid as determined in block 209, an oscillator settling time is introduced in block 210, followed by the deassertion of the PoR signals.

If an external power on reset signal is detected in block 201, block 212 introduces a wait until the external power on reset signal is deasserted. Once that is detected, the trim effuse scan is enabled in block 213. Once trim auto load is completed, flow returns to block 211.

Figure 3:
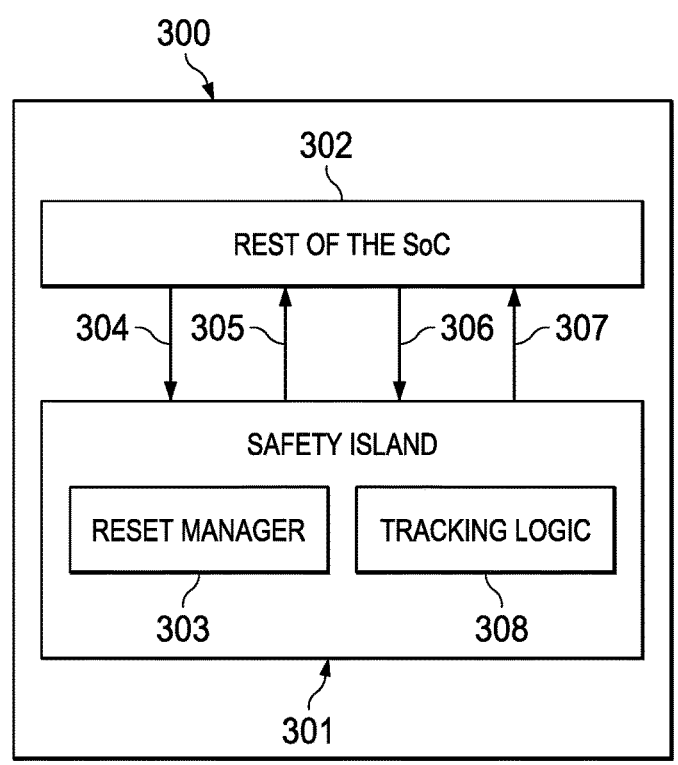
FIG. 3 shows a block diagram of the described parts of the invention.

As shown in FIG. 3, the SoC 300 is partitioned into two parts: safety island 301 and the rest of the SoC 302 including all the logic outside of the safety island. Two dedicated local reset control signals are added, 305 for controlling all the transactions from the safety island 301 to the rest of the SoC 302, and the other reset control signal 304 for all the transactions from the opposite direction. When the rest of the SoC 302 needs to go through reset, it generates a reset request signal, which is routed by 304 to the reset manager 303 inside the safety island 301 as an interrupt. Upon receiving this interrupt, the reset manager 303 will start the reset isolation sequence by asserting the two dedicated local reset control signals 304 and 305.

After these two local reset control signals are asserted, all the new transactions arriving at the boundary between safety island 301 and the rest of the SoC 302 are properly terminated to avoid system hang. Both the safety island 301 and the rest of the SoC 302 continue processing all the transactions internally and send either status or data return back to the initiator. There are bridges 306 and 307 between the safety island 301 and the rest of the SoC 302 which have tracking logic 308 to track the number of pending transactions which have been sent between safety island 301 and the rest of the SoC 302, one bridge for each direction.

When status or data for the previous pending transaction is returned from the safety island 301 to the rest of the system on a chip 302 side or from the rest of system on a chip 302 side to the safety island 301, the tracking logic 308 reduces the number of pending transactions by one for that direction. When the pending transaction count reaches zero, the bridge sends out an ack signal on 304 or 305.

The ack signals from both bridges are AND gated together by reset manager 303 as an indication that there are no more pending transactions between safety island 301 and the rest of system on a chip 302. At this point, the safety island 301 and the rest of the system on a chip 302 are isolated from each other, and the rest of the system on a chip 302 can go through reset without impacting the operation inside safety island 301.

What is claimed is:

1. A method to provide reset isolation in a system on a chip (SoC), the method comprising:
   receiving, at a safety island on the SoC, a reset request supplied by logic of the SoC external to the safety island;
   using a reset manager of the safety island to cause a plurality of reset control signals to be asserted at least partially in response to receiving the reset request;
   terminating transactions between the safety island and the logic of the SoC external to the safety island that are received after the assertion of the plurality of reset control signals;
   continuing processing transactions in the safety island that were received prior to the assertion of the plurality of reset control signals and transactions in the logic of the SoC external to the safety island that were received prior to the assertion of the plurality of reset control signals;
   monitoring data flow between the safety island and the logic of the SoC external to the safety island to determine when the processing of transactions in the safety island that were received prior to the assertion of the plurality of reset control signals and transactions in the logic of the SoC external to the safety island that were received prior to the assertion of the plurality of reset control signals are completed; and
   permitting reset of the logic of the SoC external to the safety island when the monitoring of the data flow between the safety island and the logic of the SoC external to the safety island indicates that the processing of the transactions in the safety island that were received prior to the assertion of the plurality of reset control signals and the transactions in the logic of the SoC external to the safety island that were received prior to the assertion of the plurality of reset control signals is completed.

2. The method of claim 1, wherein the logic of the SoC external to the safety island includes all logic of the SoC other than the safety island.

3. The method of claim 1, wherein the plurality of reset control signals includes:
   a first reset control signal to control transactions initiated by the safety island; and
   a second reset control signal to control transactions initiated by the logic of the SoC external to the safety island.

4. The method of claim 1, wherein monitoring the data flow between the safety island and the logic of the SoC external to the safety island includes:
   using tracking logic of the safety island to monitor a first count of transactions sent from the safety island to the logic of the SoC external to the safety island prior to the assertion of the plurality of reset control signals; and
   using the tracking logic of the safety island to monitor a second count of transactions sent from the logic of the SoC external to the safety island to the safety island prior to the assertion of the plurality of reset control signals.

5. The method of claim 4, wherein:
   for each of the transactions sent from the safety island to the logic of the SoC external to the safety island prior to the assertion of the plurality of reset control signals, the completion of the transaction reduces the first count by one; and
   for each of the transactions sent from the logic of the SoC external to the safety island to the safety island prior to the assertion of the plurality of reset control signals, the completion of the transaction reduces the second count by one.

6. The method of claim 5, wherein the processing of transactions in the safety island that were received prior to the assertion of the plurality of reset control signals and transactions in the logic of the SoC external to the safety island that were received prior to the assertion of the plurality of reset control signals is determined to be completed when the first count is equal to zero and when the second count is equal to zero.

7. The method of claim 6, wherein:
   when the first count is equal to zero, a first acknowledgement signal is to be sent from the safety island to the logic of the SoC external to the safety island via a first bridge coupling the safety island to the logic of the SoC external to the safety island; and
   when the second count is equal to zero, a second acknowledgement signal is to be sent from the logic of the SoC external to the safety island to the safety island via a second bridge coupling the safety island to the logic of the SoC external to the safety island.

8. The method of claim 7, wherein the processing of transactions in the safety island that were received prior to the assertion of the plurality of reset control signals and transactions in the logic of the SoC external to the safety island that were received prior to the assertion of the plurality of reset control signals is determined to be completed when a logic AND of the first acknowledgement signal and the second acknowledgement signal indicates no more pending transactions.

9. An electronic device comprising:
   a safety island;
   logic external to the safety island;
   wherein the safety island is configured to:
      receive a reset request supplied by the logic external to the safety island;
      cause a plurality of reset control signals to be asserted at least partially in response to receiving the reset request;
      terminate transactions between the safety island and the logic of the SoC external to the safety island that are received after the assertion of the plurality of reset control signals; and
      continue processing transactions in the safety island that were received prior to the assertion of the plurality of reset control signals;
   wherein the logic external to the safety island is, after the assertion of the plurality of reset control signals, configured to:
      continue processing transactions in the logic external to the safety island that were received prior to the assertion of the plurality of reset control signals;
   wherein the safety island is further configured to:
      monitor data flow between the safety island and the logic external to the safety island to determine when the processing of transactions in the safety island that were received prior to the assertion of the plurality of reset control signals and transactions in the logic external to the safety island that were received prior to the assertion of the plurality of reset control signals are completed; and
      permit reset of the logic external to the safety island when the monitoring of the data flow between the safety island and the logic external to the safety island indicates that the processing of the transactions in the safety island that were received prior to the assertion of the plurality of reset control signals and the transactions in the logic external to the safety island that were received prior to the assertion of the plurality of reset control signals is completed.

10. The electronic device of claim 9, wherein the safety island is an embedded safety island of a system on a chip (SoC) and the logic external to the safety island includes all logic of the SoC other than the safety island.

11. The electronic device of claim 9, wherein the plurality of reset control signals includes:
   a first reset control signal to control transactions initiated by the safety island; and
   a second reset control signal to control transactions initiated by the logic external to the safety island.

* * * * *